US012620551B2

(12) United States Patent
Vella et al.

(10) Patent No.: US 12,620,551 B2
(45) Date of Patent: May 5, 2026

(54) TOMOGRAPHIC ATOM PROBE WITH TERAHERTZ PULSE GENERATOR

(71) Applicants: CENTRE NATIONAL DE LA RECHERCHE SCIENTIFIQUE, Paris (FR); INSTITUT NATIONAL DES SCIENCES APPLIQUEES DE ROUEN, Saint Etienne du Rouvray (FR); UNIVERSITE DE ROUEN NORMANDIE, Mont-Saint-Aignan (FR)

(72) Inventors: Angela Vella, Rouen (FR); Jonathan Houard, Rouen (FR); Ammar Hideur, Le Petit-Quevilly (FR); Laurent Arnoldi, Rouen (FR); Lorenzo Rigutti, Bois Guillaume (FR)

(73) Assignees: CENTRE NATIONAL DE LA RECHERCHE SCIENTIFIQUE, Paris (FR); INSTITUT NATIONAL DES SCIENCES APPLIQUEES DE ROUEN, Saint Etienne du Rouvray (FR); UNIVERSITE DE ROUEN NORMANDIE, Mont-Saint-Aignan (FR)

( * ) Notice: Subject to any disclaimer, the term of this patent is extended or adjusted under 35 U.S.C. 154(b) by 360 days.

(21) Appl. No.: 17/623,584

(22) PCT Filed: Jul. 23, 2020

(86) PCT No.: PCT/EP2020/070775
§ 371 (c)(1),
(2) Date: Dec. 28, 2021

(87) PCT Pub. No.: WO2021/018719
PCT Pub. Date: Feb. 4, 2021

(65) Prior Publication Data
US 2022/0254601 A1 Aug. 11, 2022

(30) Foreign Application Priority Data

Jul. 29, 2019 (FR) ...................................... 1908599

(51) Int. Cl.
| | |
|---|---|
| *H01J 37/285* | (2006.01) |
| *H01J 37/20* | (2006.01) |
| *H01J 37/26* | (2006.01) |

(52) U.S. Cl.
CPC ............ *H01J 37/285* (2013.01); *H01J 37/20* (2013.01); *H01J 37/265* (2013.01); *H01J 2237/2001* (2013.01); *H01J 2237/2626* (2013.01)

(58) Field of Classification Search
None
See application file for complete search history.

(56) References Cited

U.S. PATENT DOCUMENTS 9,177,685 B1 * 11/2015 Wu .......................... G21K 5/02

OTHER PUBLICATIONS

Miaja-Avila, et al., "Coherent Extreme-Ultraviolet Source Applied to Atom Probe Tomography", OSA Technical Digest (Optical Society of America), 2018.
(Continued)

*Primary Examiner* — Eliza W Osenbaugh-Stewart
(74) *Attorney, Agent, or Firm* — Maier & Maier, PLLC

(57) ABSTRACT

A tomographic atom probe includes an analysis chamber intended to analyze a sample of material in the form of a nanotip mounted on an anti-vibration support, the nanotip being brought to a temperature of between 0 kelvin and ambient temperature, the nanotip being biased at an adjustable voltage of between 1 kV and 15 kV, the analysis chamber comprising a position-sensitive and time of flight-sensitive ion detector. The atom probe comprises a generator for generating high-peak-intensity single-cycle ultrashort terahertz pulses, the analysis chamber comprising optical
(Continued)

means for focusing the terahertz pulses, the focusing of the terahertz pulses causing the atoms of the nanotip to evaporate through the field effect without thermal effects. The terahertz pulses are generated by a femtosecond pulsed laser emitting very high-power ultrashort optical pulses at a high rate.

10 Claims, 2 Drawing Sheets

(56) References Cited

OTHER PUBLICATIONS

Vella, et al., "Evidence of field evaporation assisted by nonlinear optical rectification induced by ultrafast laser", Physical Review, vol. B73, No. 16, p. 165416, 2006.

Vella, et al., "Ultrafast emission of ions during laser ablation of metal for 3D atom probe", Applied Surface Science vol. 255, No. 10, pp. 5154-5158, 2009.
Gault, et al., "Design of a femtosecond laser assisted tomographic atom probe", Review of Scientific Instruments, vol. 77, No. 4, p. 43705 (1)-(8), 2006.
Hierink, et al., "Field emission at terahertz frequencies: AC-tunneling and ultrafast carrier dynamics", New Journal of Physics, vol. 16, No. 12, p. 123005, 2014.
Matte, et al., "Terahertz Field Emission of Femto-Coulomb Electron Bunches", 2018 43rd International Conference on Infrared, Millimeter, and Terahertz Waves (IRMMW-THz), 2018.
Bartel, et al., "Generation of single-cycle THz transients with high electric-field amplitudes", Optics Letters, vol. 30, Issue 20, pp. 2805-2807, 2005.
Dai, et al., "Terahertz Wave Air Photonics: Terahertz Wave Generation and Detection With Laser-Induced Gas Plasma", IEEE Journal of Selected Topics in Quantum Electronics, vol. 17, Issue: 1, pp. 183-190, 2011.

* cited by examiner

TOMOGRAPHIC ATOM PROBE WITH TERAHERTZ PULSE GENERATOR

CROSS-REFERENCE TO RELATED APPLICATIONS

This application is a National Stage of International patent application PCT/EP2020/070775, filed on Jul. 23, 2020, which claims priority to foreign French patent application No. FR 1908599, filed on Jul. 29, 2019, the disclosures of which are incorporated by reference in their entirety.

FIELD OF THE INVENTION

The invention lies in the general technical field of analyzing the composition of materials on the atomic scale. It relates more particularly to analysis devices that operate by evaporating a sample of the material by way of an electrical or optical pulse. More precisely, the field of the invention is that of tomographic atom probes.

BACKGROUND

In a tomographic atom probe, a DC voltage is applied to the sample of material to be analyzed. The sample, cut in the form of a tip with a small radius, generally of between 10 and 200 nanometers, is placed in a vacuum chamber. The material may be a conductor, an insulator or a semiconductor. The intense electric field thus created is sufficient to tear the atoms from the surface, which atoms are ionized and projected onto a position and time detector.

Superimposing electrical or light pulses on the DC voltage evaporates the surface atoms at precise times in the form of ions. Measuring the times of flight of the ions makes it possible to determine their chemical nature through time-of-flight mass spectroscopy. The data that are collected make it possible to represent the volume of the destroyed sample on the scale of the atomic lattice, as well as the chemical nature of each atom.

The mass resolution of an electrical pulse-assisted atom probe depends on the duration of the pulse that controls the duration of the emission and the energy dispersion of the ions. The mass resolution of a femtosecond laser pulse-assisted atom probe depends on the duration for which ions are emitted following the absorption of a light pulse.

It has been shown that this duration itself depends on the physical mechanism actually involved during evaporation. A distinction is thus drawn between a slow evaporation mechanism, the duration of which is greater than a few nanoseconds, induced by a thermal effect, and a fast evaporation mechanism, still induced by a thermal effect but in which, by virtue of the action of the intense electric field, the heating is more localized and the associated thermal dynamics are faster. This highly localized thermal mechanism produces a virtually instantaneous effect of tearing the elements from the sample. The first slow thermal mechanism is responsible for limiting the mass resolution of a laser pulse-assisted atom probe.

Laser-assisted tomographic atom probes that are currently on the market comprise a laser emitting in the near-ultraviolet range, at a wavelength of 355 nanometers. In the case of metals, this wavelength makes it possible, for suitable geometries of the sample, to confine the absorption to the end of the sample. For semiconductor materials, having a gap less than 3 eV, the absorption of laser light in the near-UV is also confined to the end of the sample. This confinement of the absorption promotes the fast evaporation mechanism.

However, in the case of insulators and semiconductors with a large gap, greater than 3 eV, the energy of the laser is weakly absorbed at the end of the tip and absorption maxima occur far from this end, giving rise to slow and delayed thermal evaporation that degrades the mass resolution of the instrument.

In addition, the strong static field applied to the sample increases the absorption at the end of the tip. The energy of the laser thus has to be adjusted according to the value of the applied electric field.

In practice, the analysis conditions are determined so as to promote the fast evaporation mechanism and to minimize the slow mechanism. However, these analysis conditions have a strong influence on the measurement of the composition of insulating and semiconductor materials. In particular, the measurement varies with the value of the applied static field.

Strong fields thus promote fast emission, but may give rise to biases in the composition measurements. On the other hand, weaker fields may give more reliable composition analyses, but with poor mass resolution. Lastly, excessively high field or laser energy values lead to the destruction of the sample through electrostatic and thermal effects.

It is therefore necessary to determine field and illumination conditions that are capable both of minimizing slow thermal evaporation and of giving composition values close to nominal values. These optimum values are difficult to determine. They depend on multiple parameters, such as the composition of the material under analysis or the geometry of the tip of the sample. However, the composition of the material under analysis is, as a principle, not exactly known. In the same way, the exact geometry of the sample is not fully understood, given the small dimensions involved. In addition, the evaporation of material during analysis changes the geometry of the sample.

Therefore, at present, the optimum analysis conditions require empirical adjustment. Furthermore, in order to analyze various samples of materials, it is generally necessary to implement a specific adjustment for each sample under analysis, including when all of the samples are formed from the same material. In addition, since the geometry of the sample varies during the analysis, the adjustments have to be modified during the analysis in order to preserve the quality of the mass spectra and of the composition measurements.

Thus, in order to overcome these various drawbacks, atom probe-based analyses are often coupled with analyses using other techniques, such as electron microscopy and photoluminescence spectroscopy. Transmission electron microscopy makes it possible to determine the geometry and structure of samples at the start and at the end of analysis. Photoluminescence makes it possible to verify, in some cases, the nominal composition in order to determine the majority species forming the material based on the emission spectra.

The composition of the materials may also be measured using alternative techniques. Mention will be made of optical methods, microanalysis through dispersive X-ray spectroscopy or through electron energy loss spectroscopy or X-ray diffraction. These various methods give a more or less precise indication of the composition of the sample. This value may be compared with that found by the atom probe.

However, the measurements obtained using complementary techniques are not always comparable to the three-dimensional information obtained using an atom probe, notably on highly inhomogeneous nano-objects for which the distribution of chemical elements on the nanoscopic scale determines their macroscopic behavior.

Carrying out repetitive analyses that make it possible for example to check that a process of producing a composite material does not vary thus proves to be a difficult and tedious operation that sometimes leads to the destruction of certain samples. In addition, attempts to analyze certain materials with a large gap, such as fluorides, systematically fail, and optimum field and laser energy conditions were not able to be determined in the case of illumination in the ultraviolet.

Finally, atom probes are nowadays opening up to biological materials and liquids that are analyzed at very low temperature in order to freeze their structures. Initial analyses show that laser-induced heating does not allow perfectly correct analysis of these samples.

The best existing solutions for covering a wide range of materials are oriented toward the use of XUV pulses to address materials with large gaps. More information about this type of probe may be found in the publication by Miaja-Avila et al. FIO 2018. Entitled "Coherent Extreme-Ultraviolet Source Applied to Atom Probe Tomography". However, the thermal effects are even more predominant in this type of atom probe.

SUMMARY OF THE INVENTION

The tomographic atom probe according to the invention substantially improves the resolution of the laser tomographic atom probe-based analysis technique by cancelling out the thermal effects inherent to the absorption of ultraviolet or infrared radiation conventionally used in these instruments. In addition, the solution makes it possible to widen the fields of application of this technique, notably for the analysis of biological compounds, while at the same time increasing the success rate of the analyses.

The atom probe according to the invention comprises a system for generating wide-spectral-band terahertz pulses, the sampled material then being a positively biased nanotip cooled to cryogenic temperature. This unprecedented combination comprising the use of a terahertz source allows the field effect-based evaporation of the atoms of the nanotip.

More precisely, the invention relates to a tomographic atom probe comprising an analysis chamber operating at ambient temperature, said analysis chamber being intended to analyze a sample of material in the form of a nanotip mounted on an anti-vibration support, said nanotip being brought to a temperature of between 0 kelvin and ambient temperature by a cryogenic device, said nanotip being biased at an adjustable voltage of between 1 kV and 15 kV by an electronic device, said analysis chamber comprising a position-sensitive and time of flight-sensitive ion detector, characterized in that said atom probe comprises a generator for generating high-peak-intensity single-cycle ultrashort terahertz pulses, the analysis chamber comprising optical means for focusing said terahertz pulses, the focusing of the terahertz pulses causing the atoms of the nanotip to evaporate through the field effect without thermal effects.

Advantageously, the terahertz pulse generator produces optical single-cycle pulses with an amplitude greater than 10 kV/cm.

Advantageously, the nanotip is brought to a temperature lower than 200 kelvins.

Advantageously, the pulse generator comprises:
a femtosecond pulsed laser emitting very high-power ultrashort optical pulses in the near-infrared spectral range, the pulses being emitted at a high rate,
a non-linear crystal able to generate, through frequency doubling, optical radiation with a wavelength equal to half that of the optical pulses,
a focusing optic for focusing said pulses and said optical radiation, the plasma formed at the focal point generating the terahertz pulses,
an optical filter for absorbing the pulses and optical radiation and transmitting the terahertz waves.

Advantageously, the non-linear crystal is beta barium borate, known by the name "BBO", or lithium triborate, known by the name "LBO", or potassium dideuterium phosphate, known by the name "KDP", or potassium titanyl phosphate, known by the name "KTP".

Advantageously, the terahertz pulse generator comprises:
a femtosecond pulsed laser emitting very high-power ultrashort optical pulses in the near-infrared spectral range, the pulses being emitted at a high rate,
a focusing optic for focusing said optical pulses,
a non-linear crystal placed at the focal point of the focusing optic and able to generate the terahertz pulses through optical rectification or through frequency difference,
an optical filter for absorbing the optical pulses and transmitting the terahertz waves.

Advantageously, the terahertz pulse generator comprises:
a femtosecond pulsed laser emitting very high-power ultrashort optical pulses in the infrared spectral range, the pulses being emitted at a high rate,
an antenna-type device based on a semiconductor junction subjected to a high electrical potential,
the ultrashort triggering of the flow of current in the junction through the illumination of said laser emitting the terahertz pulse.

Advantageously, the ion detector has a detection half-angle of between 1 and 90 degrees.

Advantageously, the ion detector is a time-of-flight mass spectrometer.

Advantageously, the optical means for focusing said terahertz pulses are a spherical or parabolic mirror or a terahertz lens operating on-axis or a parabolic mirror operating off-axis.

Advantageously, the optical filter is a silicon wafer.

Advantageously, the pulsed laser emits, at the wavelength of 400 to 3000 nanometers, light pulses whose energy is between 0.1 and 4 mJ, the emission frequency being between 1 and 200 kHz.

BRIEF DESCRIPTION OF THE DRAWINGS

Other features, details and advantages of the invention will become apparent on reading the description given with reference to the appended drawings, which are given by way of example and in which, respectively.

DETAILED DESCRIPTION

Figure 1:
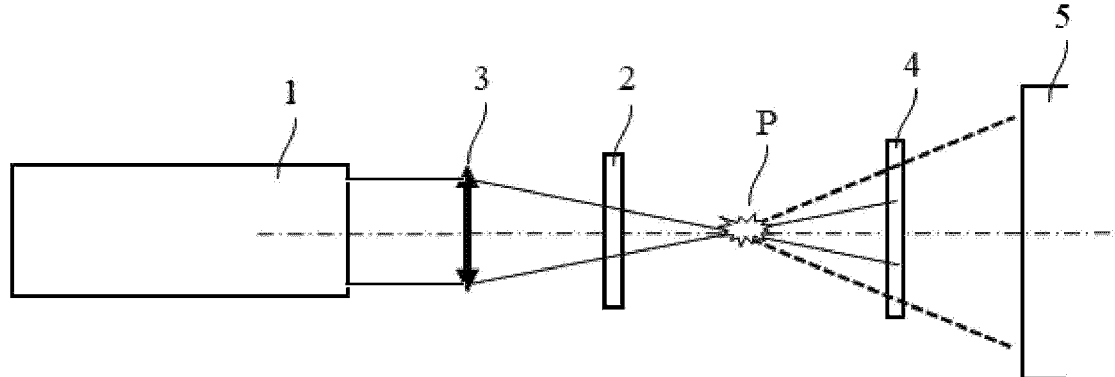
FIG. 1 shows an illustration of a first embodiment of a femtosecond pulsed laser terahertz generator.

The tomographic atom probe according to the invention essentially comprises an analysis chamber intended to analyze a sample of material and a generator for generating high-energy terahertz ultrashort pulses that will allow the sample to be analyzed.

As has been stated, it is known, in this type of atom probe, to use generators for generating ultrashort pulses in the range of the optical wavelengths. For this type of probe, the transition to terahertz waves cannot be reduced to a simple change in wavelength or frequency. Specifically, a priori, for those skilled in the art, terahertz waves have wavelengths that are too long to allow evaporation, given that the evaporation in a laser atom probe is always assisted by a thermal effect, that the terahertz waves are not able to be focused to the same extent as visible or ultraviolet light and that they are absorbed less efficiently.

It should also be noted that recent developments in this type of probe implement pulses whose wavelengths are increasingly short.

In fact, terahertz waves appear to exhibit two drawbacks, which are as follows.

At terahertz frequencies, the energy associated with photons is extremely low in comparison with the energies of photons of visible or ultraviolet light. This energy is around a thousand times lower.

At present, laser-assisted field-effect evaporation uses laser pulses in the visible or UV range and relies on a thermal effect induced by the absorption of light photons. This absorption is able to take place only if the energy of the photon is equal to or greater than the band gap energy of the material. The band gap energy may vary from a fraction of an eV to several eV. For example, it is 8 eV in the case of magnesium oxide. Since UV photons have energies greater than or comparable to the band gap energy of many materials, they are then absorbed by the material, which will heat up and lead to evaporation of the surface atoms through a thermal effect. However, THz photons having an energy 1000 times lower will not be absorbed by the material, which is therefore not able, a priori, to evaporate.

Moreover, the electric field associated with the THz pulses generated by the most efficient devices developed in research laboratories is very weak in comparison with the values of the electric field required to induce field-effect evaporation. This is due both to the low energy of the terahertz pulses the generation of which is known and to the fact that, owing to their long wavelength, these pulses are not able to be focused to the same extent as visible or ultraviolet light. The THz field that is generated is thus less than $10^3$ kV/cm, while the field necessary for evaporation is $3 \cdot 10^5$ kV/cm, that is to say three hundred times greater.

Therefore, the use of these THz pulses has until now been limited to the emission of electrons from negatively biased nanotips, requiring weaker electric fields that are compatible with the available intensities of current THz pulse sources. This is the solution discussed in the document by Herink et al. NJP 16 (2014) entitled "Field emission at terahertz frequencies: AC-tunneling and ultrafast carrier dynamics".

In fact, these lines of argument ignore two physical effects that will make it possible to very substantially increase the effects of terahertz waves.

The first effect is the antenna effect, which will give rise to an enhancement of the THz field of several orders of magnitude, in particular in the case of metals. This enhancement will make the THz field comparable to the static electric field required for field-effect evaporation. It will thus have an amplitude intense enough to give rise to the evaporation of surface atoms and an oscillation period of the field, at THz frequencies, great enough to allow atoms to cross the energy barrier in order to ionize. In this case, illuminating the samples by way of intense THz pulses allows optical field-effect evaporation. The THz pulse is then equivalent to a very fast electrical pulse.

The second effect is the resonant effect. The THz frequencies correspond to the oscillation frequencies of the atoms on the surface of the nanotip, and resonant absorption is then possible. This absorption is highly selective. It is able to take place only for atoms on the surface of the strongly biased nanotip. It thus does not generate any heating, but a controlled evaporation of the surface atoms. In the case of samples of semiconductors or insulators, studies around the behavior, under an intense field, of the molecules of these samples make it possible to highlight a change in vibrational frequencies. These frequencies decrease and are of the order of a few THz.

It is therefore possible to resonantly and selectively excite these molecules through low-amplitude THz radiation. In this case, the low amplitude of the THz pulses makes the thermal effects completely negligible.

The atom probe according to the invention is based on these two principles, which are the generation of intense THz pulses and the use of samples in the form of positively biased and cooled nanotips. The physical effects involved are the mechanisms of enhancing the THz field through the antenna effect or resonant absorption, making it possible to induce controlled ion emission at the surface of the material.

There are various technical solutions for producing a terahertz wave generation device. Technical information about this technique may be found in the following publications:

Generation of single-cycle THz transients with high electric-field amplitudes by T. Bartel et al/Oct. 15, 2005, Vol. 30, No. 20/Optics Letters;

Terahertz wave air Photonics: Terahertz Wave Generation and Detection with Laser-induced Gas Plasma by Jianming Dai et al/2010/IEEE Journal of selected topics in Quantum Electronics;

Field emission at terahertz frequencies: AC-tunneling and ultrafast carrier dynamics by G. Herink et al/New journal of Physics 16 (2014) 123005.

By way of a first exemplary embodiment, a first terahertz generator is shown in FIG. 1. In this figure, as in the following two figures, light waves are represented by unbroken lines and terahertz pulses are represented by dashed lines.

This terahertz generator comprises a femtosecond laser source 1 emitting very high-power ultrashort pulses in the near-infrared at a high rate. Each pulse propagates inside a non-linear crystal 2 so as to generate double-frequency radiation. The non-linear crystal is for example beta barium borate, known by the name "BBO". The wavelength of the radiation is therefore located in the near-ultraviolet. Use could also be made of lithium triborate, known by the name "LBO", or potassium dideuterium phosphate, known by the name "KDP", or potassium titanyl phosphate, known by the name "KTP".

This radiation and the initial pulse are focused using an air optical lens 3, thus forming a plasma P. Said plasma irradiates a terahertz wave. The original pulse and its harmonic are filtered by way of a high-resistance silicon wafer 4 that transmits the terahertz radiation. A terahertz radiation source is thus obtained. This terahertz wave is then transported, collimated and focused by an optical device 5, which is not detailed in FIG. 1.

Figure 2:
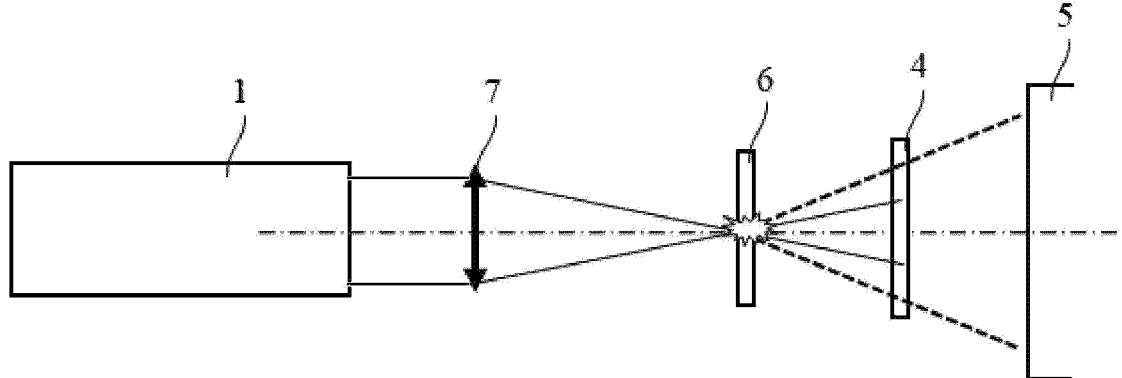
FIG. 2 shows an illustration of a second embodiment of a femtosecond pulsed laser terahertz generator.

By way of a second example, a second device is shown in FIG. 2. It also comprises a femtosecond laser source 1 emitting very high-power ultrashort pulses in the near-infrared at a high rate. Each pulse is focused inside a non-linear crystal 6 by way of an optic 7. The non-linear crystal is for example zinc telluride with the formula ZnTe, lithium niobate with the formula LiNbO3; this crystal may also be of the "DAST" type with the chemical formula 4-N,N-dimethylamino-4-N-methylstilbazolium tosylate, of the "DSTMS" type with the chemical formula 4-N,N-dim-ethylamino-4'-N'-methylstilbazolium 2,4,6-trimethylbenze-nesulfonate or of the "OH1" type with the chemical formula 3-3-(4-hydroxystyryl)-5,5-dimethylcyclohex-2-enylidene) malononitrile.

This generates a terahertz wave through optical rectifica-tion or through frequency difference. Optical rectification is the reciprocal effect of the Pockels effect. The original pulse is filtered, in the same way, by way of a high-resistance silicon wafer 4 that transmits the terahertz radiation. A terahertz radiation source is thus obtained.

By way of a third example, not shown, the terahertz pulse generator comprises:

a femtosecond pulsed laser emitting very high-power ultrashort optical pulses in the infrared spectral range, the pulses being emitted at a high rate, an antenna-type device based on a semiconductor junction subjected to a high electrical potential, the ultrashort triggering of the flow of current in the junction through the illumination of said laser emitting the terahertz pulse.

In these various configurations, the pulsed laser emits, at a center wavelength of between 400 and 3000 nanometers, light pulses whose energy is between 0.1 and 4 mJ, the emission frequency being between 1 and 200 kHz.

Figure 3:
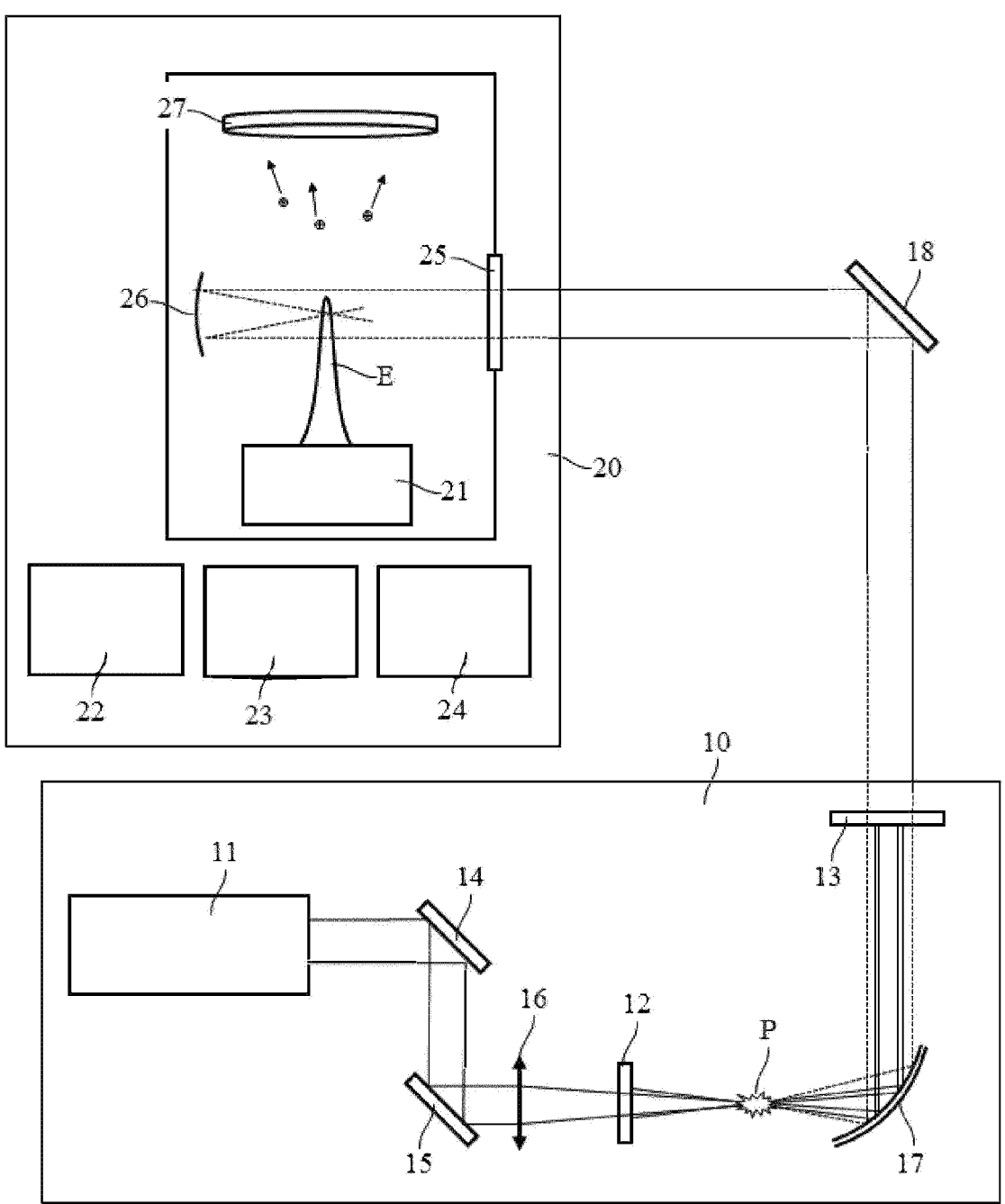
FIG. 3 shows an illustration of a tomographic atom probe according to the invention.

By way of an exemplary embodiment, a tomographic atom probe according to the invention is shown in FIG. 3. It comprises two main assemblies, which are:

the terahertz pulse generator 10;

the analysis chamber 20.

In this FIG. 3, the terahertz generator is of the same type as that shown in FIG. 1. The terahertz generator shown in FIG. 2 could also be suitable.

The generator shown in FIG. 3 essentially comprises a femtosecond laser source 11, a non-linear frequency doubler crystal 12, a filter 13 and various optics 14, 15, 16, 17 and 18. The features of these various elements are as follows:

Femtosecond Laser Source 11

Pulse wavelength: 800 nanometers

Pulse duration: a few tens of femtoseconds

Pulse rate: 1 kHertz

Pulse energy: 2 mJ to 4 mJ

Non-linear crystal 12

BBO (beta barium borate) substrate

Harmonic wavelength: 400 nanometers

Filter 13

Silicon substrate

The optical elements 14 and 15 are simple plane deflec-tion mirrors. The first lens 16 focuses the light pulses and forms the plasma P. The first mirror 16 is an off-axis parabolic mirror that collimates the terahertz waves. The second mirror 18 is a plane mirror comprising an indium-tin oxide (ITO) treatment that reflects the terahertz waves.

The analysis chamber 20 is a vacuum chamber. It is intended to analyze samples E of various types and of various compositions. These samples may be metals, semi-conductors, oxides or biological or pharmaceutical materi-als. These materials may have a large band gap.

These samples E are in the form of a nanotip. The analysis chamber comprises a sample support 21 mounted on an anti-vibration device, a piezoelectric device 22 for finely positioning the sample, and electronic means 23 for bringing the nanotip to a voltage greater than 10 kVolts. The chamber comprises a cryogenic compressor 24 for cooling the nano-tip to a temperature of between 0 kelvin and 80 kelvins. It is possible to work at higher temperatures, typically of the order of 200 kelvins, or even at ambient temperature.

The analysis chamber comprises a diamond window 25 that makes it possible to transmit the terahertz waves and a spherical mirror 26 that makes it possible to focus the terahertz waves on the nanotip of the sample. This spherical mirror operates on its axis. Use could also be made of a parabolic mirror or a terahertz lens operating on-axis or else a parabolic mirror operating off-axis.

The analysis chamber comprises a position-sensitive and time of flight-sensitive detector 27 with a wide viewing angle of +/−90°, making it possible to calculate, through back-projection, the original position in the sample of the emitted ions with a resolution lower than a nanometer. The ions are shown by circled crosses in FIG. 3. The detector also comprises means for chemically identifying the emitted ions through time-of-flight mass spectrometry.

The atom probe comprises means for characterizing the terahertz waves using electro-optical methods. An electro-optical crystal, such as gallium phosphide (GaP) or zinc telluride (ZnTe), may be used for this purpose. These methods are known to those skilled in the art.

Finally, the atom probe comprises various electric power supply, control, management and processing electronic means that supply power to the various devices, synchroni-zation them, and store measurements and process them. These various means are not shown in FIG. 3.

In particular, the processing means comprise reconstruc-tion algorithms for carrying out chemical tomography on the sample under analysis.

The main advantages of the THz pulse-assisted tomo-graphic atom probe according to the invention are:

ensuring the analysis of any type of material in optimum conditions, regardless of the geometry and the compo-sition of the material;

increasing the reliability of the measurements of the composition of metals, semiconductors and oxides;

increasing the success rate of the analyses on these materials;

analyzing materials with a large gap and biological and pharmaceutical materials.

The invention claimed is:

1. A tomographic atom probe comprising an analysis chamber operating at ambient temperature, said analysis chamber having a sample (E) of material in the form of a nanotip mounted on an anti-vibration support, said nanotip being brought to a temperature of between 0 kelvin and ambient temperature by a cryogenic device, said nanotip being biased at an adjustable positive voltage of between 1 kV and 15 kV by an electronic device, said analysis chamber comprising a position-sensitive and time of flight-sensitive ion detector, wherein said atom probe comprises a generator for generating high-peak-intensity single-cycle ultrashort terahertz pulses, the analysis chamber comprising optical means for focusing said terahertz pulses on the nanotip, the focusing of the terahertz pulses causing the atoms of the nanotip to evaporate through the field effect without thermal effects, wherein the terahertz pulse generator produces opti-cal single-cycle pulses with an amplitude greater than 10 kV/cm.

2. The tomographic atom probe as claimed in claim 1, wherein the nanotip is brought to a temperature lower than 200 kelvins.

3. The tomographic atom probe as claimed in claim 1, wherein the terahertz pulse generator comprises:

a femtosecond pulsed laser emitting ultrashort optical pulses in the near infrared spectral range, a non-linear crystal able to generate, through frequency doubling, optical radiation with a wavelength equal to half that of the optical pulses, a focusing optic for focusing said pulses and said optical radiation, the plasma formed at the focal point generating the terahertz pulses, an optical filter for absorbing the pulses and optical radiation and transmitting the terahertz waves.

4. The tomographic atom probe as claimed in claim 3, wherein the non-linear crystal is beta barium borate, known by the name "BBQ", or lithium triborate, known by the name "LBO", or potassium di deuterium phosphate, known by the name "KDP", or potassium titanyl phosphate, known by the name "KTP".

5. The tomographic atom probe as claimed in claim 3, wherein the optical filter is a silicon wafer.

6. The tomographic atom probe as claimed in claim 3, wherein the pulsed laser emits, at a wavelength of between 400 and 3000 nanometers, light pulses whose energy is between 0.1 and 4 mJ, the emission frequency being between 1 and 200 KHz.

7. The tomographic atom probe as claimed in claim 1, wherein the terahertz pulse generator comprises:

a femtosecond pulsed laser emitting ultrashort optical pulses in the near infrared spectral range, a focusing optic for focusing said optical pulses, a non-linear crystal placed at the focal point of the focusing optic and able to generate the terahertz pulses through optical rectification or through frequency difference, an optical filter for absorbing the optical pulses and transmitting the terahertz waves.

8. The tomographic atom probe as claimed in claim 1, wherein the ion detector has a detection half-angle of between 1 and 90 degrees.

9. The tomographic atom probe as claimed in claim 1, wherein the ion detector is a time-of-flight mass spectrometer.

10. The tomographic atom probe as claimed in claim 1, wherein the optical means for focusing said terahertz pulses are a spherical or parabolic mirror or a terahertz lens operating on-axis or a parabolic mirror operating off-axis.

* * * * *